(12) United States Patent
Linke et al.

(10) Patent No.: US 6,363,097 B1
(45) Date of Patent: Mar. 26, 2002

(54) SEMICONDUCTOR LASER WITH A REWRITABLE WAVELENGTH STABILIZER

(75) Inventors: Richard A. Linke, Laurenceville; Hirohito Yamada, Plainsboro, both of NJ (US)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/157,186

(22) Filed: Sep. 18, 1998

(51) Int. Cl.[7] .............................. H01S 3/08; H01S 3/30; H01S 5/00; G02B 6/00; G03H 1/02
(52) U.S. Cl. ............................. 372/102; 372/6; 372/46; 372/50; 372/96; 372/20; 385/37; 385/122; 385/129; 359/3; 359/6; 359/7
(58) Field of Search ..................... 372/20, 6.46, 50.96, 372/102; 385/37, 122, 129; 359/3, 6, 7

(56) References Cited

U.S. PATENT DOCUMENTS

| | | | | |
|---|---|---|---|---|
| 4,412,235 A | * | 10/1983 | Bois | 257/84 |
| 5,103,455 A | * | 4/1992 | Eichen et al. | 372/50 |
| 5,440,669 A | * | 8/1995 | Rakuljic et al. | 359/7 |
| 5,691,989 A | * | 11/1997 | Rakuljic et al. | 372/20 |
| 5,920,409 A | * | 7/1999 | Chadi et al. | 359/15 |
| 6,023,352 A | * | 2/2000 | Haskal | 359/3 |

OTHER PUBLICATIONS

Richard A. Linke, et al., "Diffraction from Optically Written Persistent Plasma Gratings in Doped Compound Semiconductors", Appl. Phys. Lett. 65(1) Jul. 4, 1994, pp. 16–18.

* cited by examiner

Primary Examiner—James W. Davie
Assistant Examiner—Cornelius H. Jackson
(74) Attorney, Agent, or Firm—Scully, Scott, Murphy & Presser

(57) ABSTRACT

A semiconductor laser with a rewritable wavelength stabilizer which comprises a laser mirror made of a grating written into a photorefractive material, in which the oscillation wavelength of the laser diode is determined by the period of the grating. This allows the refractive index of the grating to be changed by illuminating the photorefractive material after cooling thereof to a temperature at which most of the doped impurities form DX centers. The grating can be erased by heating the photorefractive material to a temperature at which most DX centers are ionized, which erases the grating. Thereafter the photorefractive material is cooled again to a temperature at which most impurities become DX centers, and a new grating can be written in the photorefractive material. The wavelength of the semiconductor laser can be changed repeatedly by erasing and rewriting the grating therein. The laser diode is maintained and operated at a low temperature to maintain the grating semi-permanently therein while the temperature remains low.

31 Claims, 4 Drawing Sheets

SEMICONDUCTOR LASER WITH A REWRITABLE WAVELENGTH STABILIZER

BACKGROUND OF THE INVENTION

Field of the Invention

The present invention relates generally to a semiconductor laser with a rewritable wavelength stabilizer, and more particularly pertains to a semiconductor laser diode (LD) with a rewritable wavelength stabilizer, for example a grating, which makes it possible to change the wavelength of LDs after their fabrication.

The present invention applies to single-longitudinal mode LDs, such as DFB-LDs (distributed feedback laser diodes) or DBR-LDs (distributed Bragg reflector laser diodes), which are widely used in optical communication systems. The oscillation wavelengths of these LDs are determined by the grating period and by the structure (dimensions and materials) of their waveguide. These structural parameters must be decided before their fabrication, and also are not easily reproducible in the fabrication process, and therefore, it is normally impossible to change their wavelengths after finishing their fabrication.

Semiconductor laser diodes (LDs) have become very useful devices for optical communications. However, recent wavelength-division-multiplexing (WDM) systems require precise control of their wavelength. The oscillation wavelength of LDs is determined by their waveguide material and structure. Therefore, it is impossible to change their wavelength after finishing their fabrication. This makes it difficult to control the wavelength of LDs. If LDs with the required wavelengths cannot be obtained, then they must be refabricated from the first step of their fabrication process. The wavelength controllability of LDs is not sufficient for mass production of LDs suitable for WDM. Therefore, the production yield of LDs to obtain the required wavelength is quite low in mass production.

The present invention preferably uses materials which have a nonconventional local photorefractive effect which makes it possible to erase and rewrite gratings, although conventional nonlocal photorefractive materials may also be suitable for some embodiments. By using these photorefractive materials as reflective mirrors of the LD cavities, the operational wavelength of the LDs can be changed at any time by changing the grating period written into the photorefractive materials.

The grating can be erased by heating the material above an annealing temperature which depends upon the material. A grating can be rewritten after cooling by illuminating the material in order to change DX centers into a metastable state, thereby creating a diffraction grating. Therefore, the grating in these materials can be repeatedly erased and rewritten. This makes it possible to change the wavelength of the LDs at any time after their fabrication.

SUMMARY OF THE INVENTION

Accordingly, it is a primary object of the present invention to provide a semiconductor laser with a rewritable wavelength stabilizer.

The present invention solves the problem of wavelength control of LDs after fabrication by providing a method and structure which makes it possible to change the wavelength of LDs after their fabrication.

In accordance with the teachings herein, the present invention provides a semiconductor laser diode comprising a laser mirror made of a grating written in a photorefractive material, in which the oscillation wavelength of the laser diode is determined by the period of the grating. This allows the refractive index of the grating to be changed by illuminating the photorefractive material after cooling thereof to a temperature at which nearly half of the doped impurities form DX centers.

In greater detail, the grating can be erased by heating the photorefractive material to a temperature at which most DX centers are ionized, which erases the grating. Thereafter the photorefractive material is cooled again to a temperature at which nearly half of the impurities become DX centers, and a new grating can be written in the photorefractive material. The wavelength of the semiconductor laser can be changed repeatedly by erasing and rewriting the grating therein.

The photorefractive material is maintained and operated at a low temperature to maintain the grating semipermanently therein while the temperature remains low. A thermoelectric Peltier cooler can be used to maintain the photorefractive material at a low operating temperature.

The grating can be written in the photorefractive material by a holographic lithography method using a laser to create optical interference on the photorefractive material between two laser beams divided from the laser.

The photorefractive material is preferably used as a reflective mirror of the cavity of the laser diode, and can be used as a distributed bragg reflector (DBR) mirror in the laser diode, or as a distributed feedback (DFB) mirror.

The photorefractive materials can be semiconductors with impurities which form DX centers, such as Ga doped $CdF_2$, or Si or Te doped AlGaAs.

The laser diode can be optically coupled with the photorefractive grating mirror by a lens by collimating an optical beam from a facet of the laser diode and directing it into the photorefractive mirror. An antireflective coating can be placed on the laser diode facet facing the lens to prevent FP-mode laser oscillations.

The laser diode can be fabricated by first preparing a conventional FP laser diode with buried heterostructure, etching a portion of the laser diode cavity from the surface to the depth of the substrate, and then embedding the removed portion with the photorefractive material.

An index matching layer can be introduced between the laser diode waveguide and the photorefractive mirror to minimize the effect of a large refractive index difference between the laser diode waveguide material and the photorefractive material.

BRIEF DESCRIPTION OF THE DRAWINGS

The foregoing objects and advantages of the present invention for a semiconductor laser with a rewritable wavelength stabilizer may be more readily understood by one skilled in the art with reference being had to the following detailed description of several preferred embodiments thereof, taken in conjunction with the accompanying drawings wherein like elements are designated by identical reference numerals throughout the several views, and in which.

DETAILED DESCRIPTION OF THE DRAWINGS

Figure 1A:
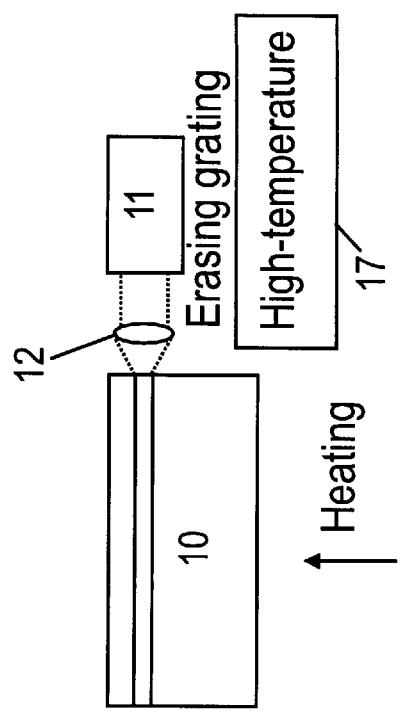
FIG. 1(a) illustrates an LD constructed with a photorefractive material being operated at a low temperature.

Referring to the drawings in detail, FIG. 1 illustrates the principles of operation of the present invention. Single-longitudinal mode LDs, such as DFB-LDs (distributed feedback laser diodes) or DBR-LDs (distributed Bragg reflector laser diodes), are widely used in optical communication systems. The oscillation wavelengths of these LDs are determined by the grating period and the structure (dimensions and materials) of their waveguide. These structural parameters must be decided before their fabrication. Therefore, it is impossible to change their wavelength after finishing their fabrication.

Of course, slight tuning of their wavelength is possible by changing the temperature of the LDs or by changing the current injected into the LDs. The present invention does not enable such slight wavelength tuning, but realizes a wide change in their operational wavelength at any time after finishing their fabrication by using a material in the LD in which a grating can be erased and rewritten repeatedly.

The present invention preferably uses materials containing DX centers which produce a local photorefractive effect and which make it possible to erase and rewrite gratings. Using these photorefractive materials as reflective mirrors of the LD cavities, the operational wavelength of the LDs can be changed at any time by changing the grating period written into the photorefractive materials.

Using Si or Te doped AlGaAs materials or Ga doped $CdF_2$ materials, for example, as the photorefractive materials, the doped impurities form DX centers at low temperature, and under illumination release free-electrons into the conduction band. The plasma effect then changes the refractive index of the host material. These phenomena were reported by R. A. Linke, et al. (R. A. Linke, et al., Appl. Phys. Lett., vol. 65, p. 16, 1994).

Therefore, the refractive index of the materials can be changed by illuminating them after cooling below a temperature at which most of the doped impurities form the DX centers. These refractive index changes can be induced in small regions with a size of less than 1 μm. Therefore, very fine pitched gratings can be written into the medium. Furthermore, the refractive index change is maintained after removing the illumination by the writing beam. Therefore, if a grating structure is written in the material at low temperature, the grating is maintained semi-permanently while the temperature remains low.

The grating can be erased by heating the material above an annealing temperature which depends upon the material, because most DX centers are ionized at high-temperatures and thus the locally modified structure of the refractive index is erased at high-temperatures.

A grating can be rewritten after cooling by illuminating the material in order to change most of the doped impurities to DX centers. Therefore, the grating in these materials can be repeatedly erased and rewritten. This makes it possible to change the wavelength of the LDs at any time after their fabrication.

FIG. 1 illustrates the basic mechanisms of the present invention. FIG. 1(a) illustrates an LD 10 constructed with a DBR mirror 11 formed of a photorefractive material having a grating written therein. Optical coupling between the LD 10 and the photorefractive grating mirror 11 is made with a lens 12 by collimating an optical beam from the LD facet 13 and directing it by the lens 12 into the photorefractive mirror 11. Laser oscillation producing an output beam 14 at the wavelength corresponding to the grating period is obtained by injecting current at 15 into the LD while maintaining the photorefractive mirror at a low-temperature, as indicated at 16.

Figure 1B:
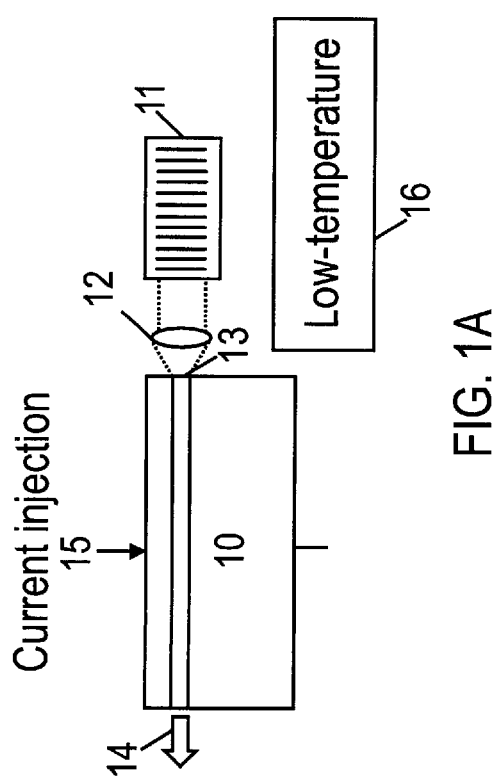
FIG. 1(b) illustrates an LD constructed with a photorefractive material being erased at a high temperature.

FIG. 1(b) illustrates an LD 10 constructed with a photorefractive material which is written with a grating being erased at a high temperature, as indicated at 17.

Figure 1C:
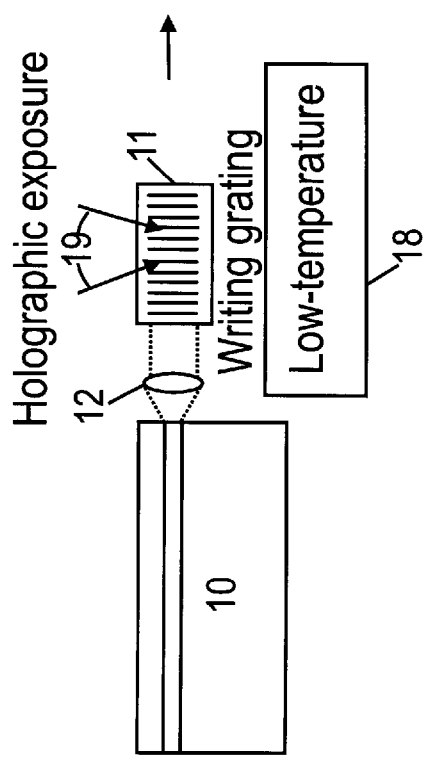
FIG. 1(c) illustrates an LD constructed with a photorefractive material being cooled to a low temperature, at which the photorefractive material is written into with a grating, as illustrated in FIG. 1(d).
Figure 1D:
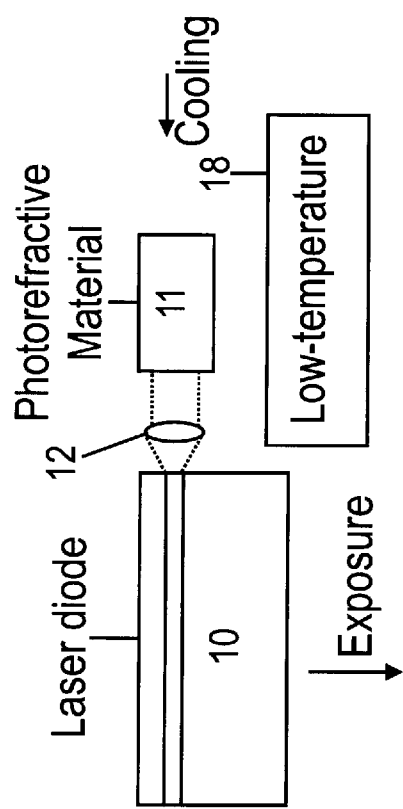

FIG. 1(c) illustrates an LD constructed with a photorefractive material being cooled, as indicated at 18, to a low temperature prior to writing a grating by a holographic exposure 19 into the photorefractive material, as illustrated in FIG. 1(d).

Figure 2:
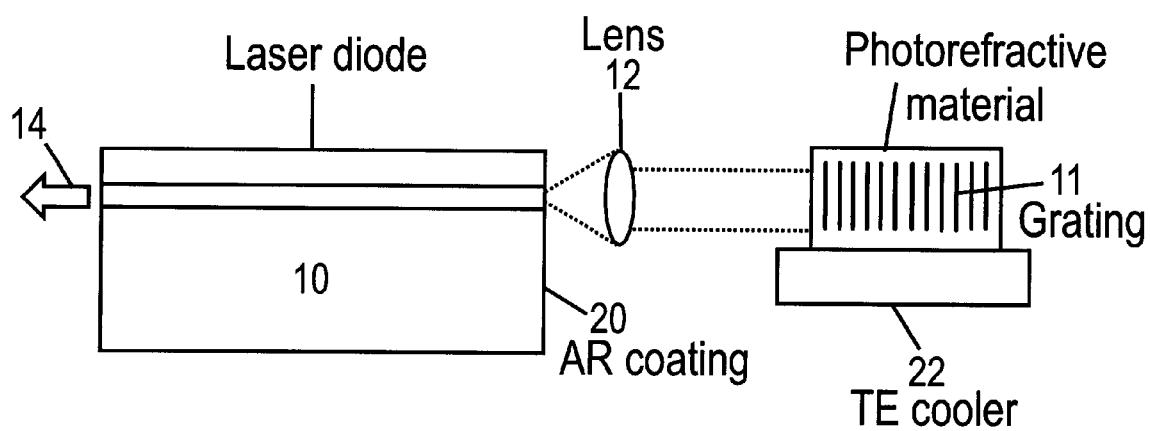
FIG. 2 illustrates a first embodiment of the present invention, and shows the basic structure of a 1.55-μm LD with a grating formed in the photorefractive material which is used as a DBR mirror.

FIG. 2 illustrates a first embodiment of the present invention, and shows the basic structure of a 1.55-μm LD 10 with a grating 11 formed in the photorefractive material which is used as a DBR (Distributed Bragg Reflector) mirror. Any other wavelength, for example 1.33-μm, short-wavelength or visible, LDs can also be realized in the same manner although the material which composes the active regions of the LDs may be different. The oscillation wavelength of the LD is determined by the grating period. Conventional 1.55-μm InGaAsP FP-LDs can be used for the optical-gain material. Optical coupling between the LD 10 and the photorefractive grating mirror 11 is made with a lens 12 which collimates an optical beam from the LD facet and directs it into the photorefractive material. An antireflective (AR) coating 20 on the LD facet facing forward to the lens is effective to prevent FP-mode lasing oscillations due to the facet mirror. The material is kept cold in order to maintain the photorefractive grating. In the case of $CdF_2$: Ga material, the temperature must be maintained below 170 K. A TE Peltier cooler 22 can be used to keep the materials at low temperatures. For other choices of the photorefractive materials, Si or Te doped AlGaAs can also be used, although the operation temperature may be different.

The grating can be written in the photorefractive materials by a holographic lithography method using a He-Cd laser which makes optical interference on the cooled material between two laser beams divided from the He-Cd laser. The grating period is around 500 nm for $CdF_2$.

Lasing oscillation at the wavelength corresponding to the grating period can be obtained by injecting current into the LD while maintaining the photorefractive mirror at a low-temperature. To change the wavelength, the grating can be erased and rewritten by heating the photorefractive material to its annealing temperature, and then cooling again, and rewriting a new grating corresponding to the new wavelength. The wavelength can be repeatedly rewritten.

As the photorefractive material, Ga doped $CdF_2$ is suitable because the material is sensitive at the wavelength around 400 nm at which the grating is written into the material, and is less sensitive at the wavelengths around 1.3-μm or 1.55-μm, where it is used as a DBR mirror of the operating LD. This means that the grating writing optical power may be small, and high operating LD power can be obtained because the light output in the longer wavelength does not disturb the grating. Calculations indicate that the required laser energy to write the grating is less than 500 mJ/cm$^2$, and that the grating can be maintained more than 1 year when the LD is operated at 10 mW CW light output power.

Figure 3:
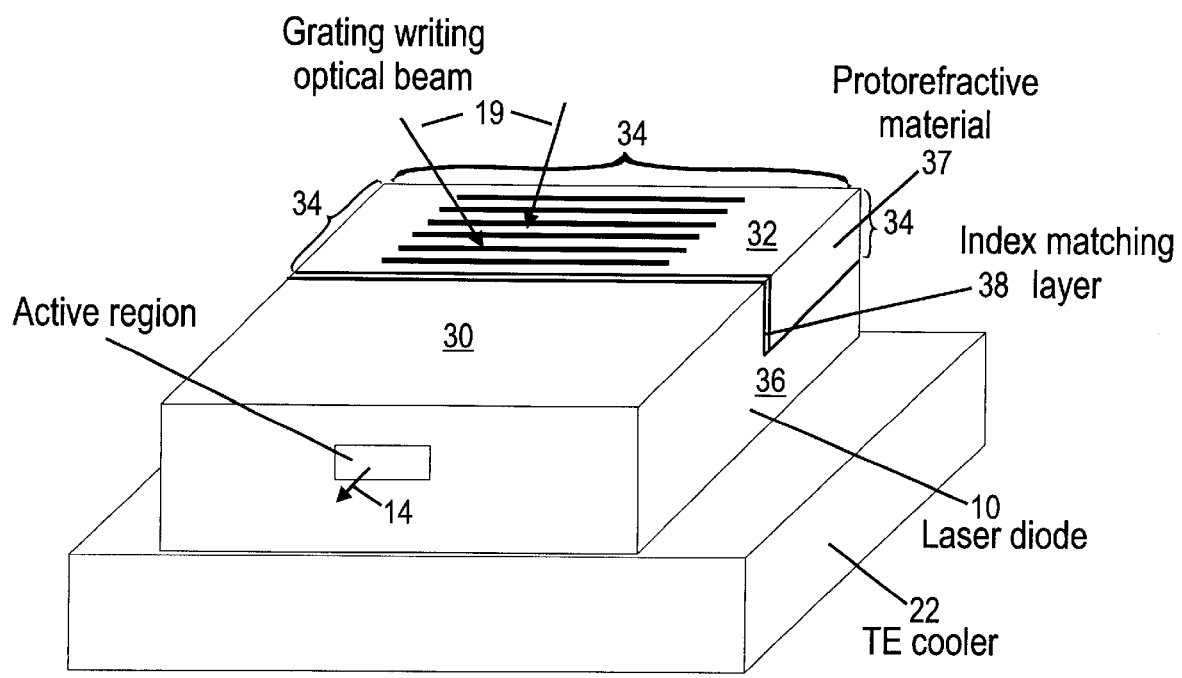
FIG. 3 illustrates an advanced structure of the present invention which is integrated with a gain medium and photorefractive DBR mirrors.

FIG. 3 illustrates an advanced integrated structure of the present invention which integrates a gain medium 30 and the photorefractive DBR mirrors 32.

The fabrication process is as follows. First, a conventional FP-LD with buried heterostructure is prepared. The wavelength does not matter, 1.3-$\mu$m or 1.55-$\mu$m LD can be fabricated in the same manner. Next, the rear half portion 34 of the LD cavity is etched from the surface to the depth of the substrate 36 and then removed. Then, the removed portion is embedded with the photorefractive material 37, for example CdF$_2$: Ga, with a MBE or MOVPE growth technology. Especially in the case of using CdF$_2$ as the photorefractive material, an index matching layer 38, which is made of materials with the thickness of quarter-wavelength and the refractive index of Sqrt{n(LD)*n(CdF$_2$)}, should be introduced between the LD waveguide 30 and the photorefractive mirror 32 because the large refractive index difference between LD waveguide material (n=3.5) and CdF$_2$ (n=1.57) would introduce a large optical coupling loss between the LD waveguide and the photorefractive mirror. The matching layer can reduce the mismatch loss.

When operating the device, the grating is written in the photorefractive material at a low temperature. The integrated device is stable in operation because there is no mechanical structure such as a lens.

Figure 4:
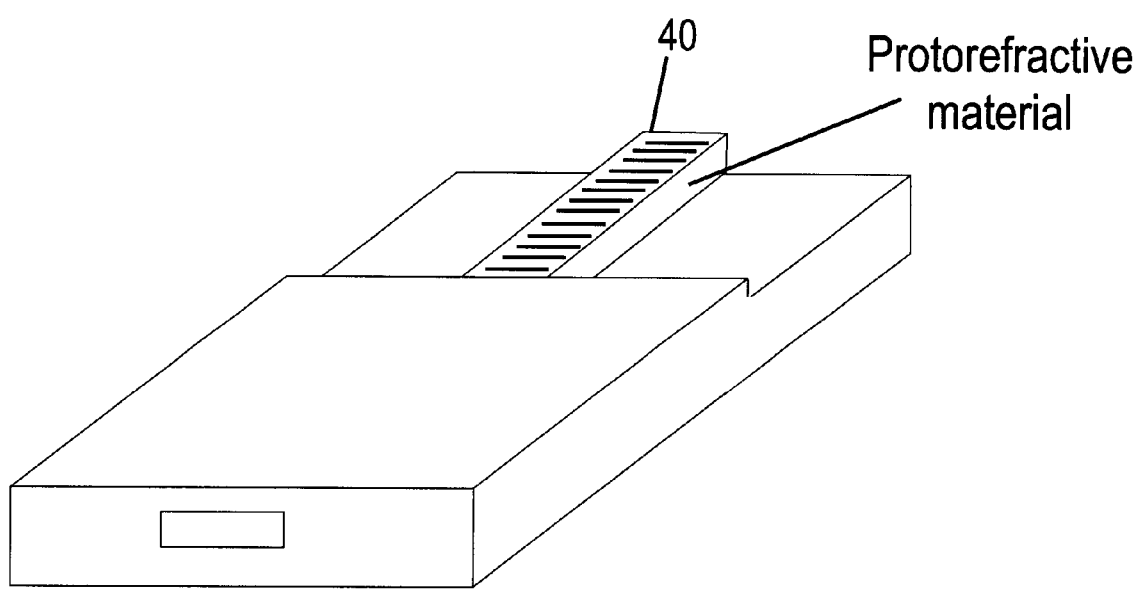
FIG. 4 shows a more advanced structure of the present invention in which an optical waveguide structure in the photorefractive material makes it possible to realize high efficiency optical coupling between the LD and the photorefractive mirror.

FIG. 4 shows a more advanced structure in which an optical waveguide structure 40 in the photorefractive material forming the mirror makes it possible to realize high optical coupling between the LD and the photorefractive mirror. Low threshold current operation may be possible for this structure.

While several embodiments and variations of the present invention are described in detail herein, it should be apparent that the disclosure and teachings of the present invention will suggest many alternative designs to those skilled in the art.

What is claimed is:

1. A semiconductor laser diode comprising:
   a laser mirror made of a grating written in a photorefractive material in which the oscillation wavelength of the laser diode is determined by the period of the grating, wherein the photorefractive material has a characteristic which allows the refractive index of the grating to be changed by illuminating the photorefractive material; and
   means for changing the refractive index of the grating.

2. A semiconductor laser diode as in claim 1, wherein the photorefractive material is a semi-conductor with impurities which form DX centers, the means for changing the refractive index of the grating comprises:
   cooling means for cooling the photorefractive material below a temperature at which many of the doped impurities form DX centers; and
   illuminating means for illuminating the photorefractive material after cooling the photorefractive material.

3. A semiconductor laser diode as in claim 2, wherein the photorefractive material is heated to a temperature at which most DX centers are ionized and an existing grating is erased, and thereafter the photorefractive material is cooled again to a temperature at which most impurities become DX centers and a grating is written in the photorefractive material, thereby allowing the wavelength of the semiconductor laser to be changed repeatedly by erasing and rewriting the grating therein.

4. A semiconductor laser diode as in claim 1, further comprising:
   means for maintaining and operating the laser diode at a low temperature to maintain the grating semi-permanently therein while the temperature remains low; and
   heating means for heating the photorefractive material above its annealing temperature to ionize most DX centers and erase the locally modified structure of the refractive index.

5. A semiconductor laser diode as in claim 1, wherein the grating is written in the photorefractive material by a holographic lithography method using a laser to create optical interference on the photorefractive material between two laser beams divided from the laser.

6. A semiconductor laser diode as in claim 1, wherein the photorefractive material is used as a reflective mirror of the cavity of the laser diode.

7. A semiconductor laser diode as in claim 1, wherein the grating is used as a distributed bragg reflector (DBR) mirror in the laser diode.

8. A semiconductor laser diode as in claim 1, wherein the mirror comprises a distributed feedback (DFB) mirror.

9. A semiconductor laser diode as in claim 1, wherein the photorefractive material is Ga doped CdF$_2$.

10. A semiconductor laser diode as in claim 1, wherein the photorefractive material is Si or Te doped AlGaAs.

11. A semiconductor laser diode as in claim 1, wherein a thermoelectric Peltier cooler is used to maintain the photorefractive material at a low operating temperature.

12. A semiconductor laser diode as in claim 1, wherein the laser diode is optically coupled with the photorefractive grating mirror by a lens by collimating an optical beam from a facet of the laser diode and directing it into the photorefractive mirror.

13. A semiconductor laser diode as in claim 12, wherein an antireflective coating is placed on the laser diode facet facing the lens to prevent FP-mode laser oscillations.

14. A semiconductor laser diode as in claim 1, wherein the laser diode is fabricated by first preparing a conventional FP laser diode with buried heterostructure, a portion of the laser diode cavity is etched and removed from the surface to the depth of a substrate, and then the removed portion is embedded with the photorefractive material.

15. A semiconductor laser diode as in claim 14, wherein an index matching layer is introduced between the laser diode waveguide and the photorefractive mirror to minimize the effect of a large refractive index difference between the laser diode waveguide material and the photorefractive material.

16. A semiconductor laser diode as in claim 1, wherein after the semiconductor laser diode is fabricated, the refractive index of the grating is changed by illuminating and rewriting the grating in the photorefractive material.

17. A method of fabricating a semiconductor laser diode comprising, fabricating the laser diode with a laser mirror made by writing a grating in a photorefractive material, wherein the oscillation wavelength of the laser diode is determined by the period of the grating, and after the semiconductor laser diode is fabricated, changing and rewriting the grating by illuminating the photorefractive material.

18. A method as in claim 17, including selecting as the photorefractive material a semiconductor with impurities which form DX centers, and changing the refractive index of the grating by illuminating the photorefractive material after cooling the photorefractive material below a temperature at which many of the doped impurities form DX centers.

19. A method as in claim 18, including erasing a grating already present in the photorefractive material by heating the photorefractive material to a temperature at which most DX centers are ionized, and thereafter cooling the photorefractive material to a temperature at which most impurities form DX centers, and writing a new grating in the photorefractive material, thereby changing the wavelength of the semiconductor laser by erasing and rewriting the grating therein.

20. A method as in claim 17, including maintaining and operating the laser diode at a low temperature to maintain the grating semi-permanently therein while the temperature remains low, and erasing the grating by heating the material above its annealing temperature to ionize most DX centers and erase the locally modified structure of the refractive index.

21. A method as in claim 17, including writing the grating in the photorefractive material by a holographic lithography method using a laser to create optical interference on the photorefractive material between two laser beams divided from the laser.

22. A method as in claim 17, including fabricating the photorefractive material as a reflective mirror of the cavity of the laser diode.

23. A method as in claim 17, including fabricating the grating as a distributed bragg reflector (DBR) mirror in the laser diode.

24. A method as in claim 17, including fabricating the semiconductor laser diode with a distributed feedback (DFB) mirror.

25. A method as in claim 17, including fabricating the semiconductor laser diode with a photorefractive material of Ga doped $CdF_2$.

26. A method as in claim 17, including fabricating the semiconductor laser diode with a photorefractive material of Si or Te doped AlGaAs.

27. A method as in claim 17, including using a thermoelectric Peltier cooler to maintain the photorefractive material at a low operating temperature.

28. A method as in claim 17, including optically coupling the laser diode with the photorefractive grating mirror by a lens by collimating an optical beam from a facet of the laser diode and directing it into the photorefractive mirror.

29. A method as in claim 28, including placing an anti-reflective coating on the laser diode facet facing the lens to prevent FP-mode laser oscillations.

30. A method as in claim 17, including fabricating the laser diode by first preparing a conventional FP laser diode with buried heterostructure, etching and removing a portion of the laser diode cavity from the surface to the depth of a substrate, and then embedding the removed portion with the photorefractive material.

31. A method as in claim 30, including introducing an index matching layer between the laser diode waveguide and the photorefractive mirror to minimize the effect of a large refractive index difference between the laser diode waveguide material and the photorefractive material.

* * * * *